United States Patent
Tanaka et al.

(10) Patent No.: US 8,546,220 B1
(45) Date of Patent: Oct. 1, 2013

(54) METHOD FOR FABRICATING BURIED BIT LINES

(75) Inventors: Isao Tanaka, Taichung (TW); Chien-hua Tsai, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 0 days.

(21) Appl. No.: 13/551,919

(22) Filed: Jul. 18, 2012

(51) Int. Cl.
*H01L 21/336* (2006.01)

(52) U.S. Cl.
USPC .......... 438/270; 257/302; 257/E21.657; 257/E21.658; 257/E21.41

(58) Field of Classification Search
USPC ......... 438/270, 272, 430, 696, 700; 257/302, 257/328, E21.657, E21.658, E21.41
See application file for complete search history.

(56) References Cited

U.S. PATENT DOCUMENTS

| | | | |
|---|---|---|---|
| 7,964,463 B2 * | 6/2011 | Kang | 438/270 |
| 8,120,103 B2 | 2/2012 | Hong | |
| 2012/0007171 A1 | 1/2012 | Kim et al. | |

* cited by examiner

*Primary Examiner* — David Vu
(74) *Attorney, Agent, or Firm* — Muncy, Geissler, Olds & Lowe, PLLC

(57) ABSTRACT

A method for fabricating buried bit lines comprises steps of: defining a plurality of parallel masked regions and a plurality of first etched regions each forming between any two neighboring masked regions on a surface of a substrate, and wherein the masked region is wider than the first etched region; etching the first etched regions to form a plurality of first trenches and a plurality of first pillars; forming two bit lines respectively on two sidewalls of each first trench; etching the first pillars to form a plurality of second pillars corresponding to the bit lines. The present invention uses a two-stage etching process to prevent pillars from bending or collapsing due to high aspect ratio. Moreover, the present invention has a simple process and is able to reduce cost and decrease cell size.

10 Claims, 5 Drawing Sheets

METHOD FOR FABRICATING BURIED BIT LINES

FIELD OF THE INVENTION

The present invention relates to a semiconductor process, particularly to a method for fabricating buried bit lines.

BACKGROUND OF THE INVENTION

The advance of semiconductor technology not only effectively reduces the size of electronic elements but also obviously decreases the fabrication cost of electronic elements. For many years, planar semiconductor structure is fabricated in limited semiconductor techniques such as etching, ion implantation, wiring, etc. The smallest chip has been as small as 6F2 so far. However, the technical advance in reducing the feature size has been gradually slowed down, and it is hard to further obviously reduce the area occupied by a chip in a wafer. On the other side, the vertical (solid) semiconductor technology is growing mature, wherein the semiconductor structure is vertically grown on a wafer to reduce the area occupied by a transistor, thus the chip size can be reduced to 4F2.

For examples, a US publication No. 20120007171 disclosed "Semiconductor Device Having Vertical Transistor and Buried Bit Line and Method for Fabricating the Same", and a U.S. Pat. No. 8,120,103 disclosed "Semiconductor Device with Vertical Gate and Method for Fabricating the Same". In the above-mentioned prior arts, bit lines are fabricated via an ion implantation technique or an etching technique. Next, an oxide layer is deposited on the bit lines to form buried bit lines. Then is undertaken the transistor fabrication process or the DRAM fabrication process.

No matter which method is used to fabricate buried bit lines, trenches and pillars must be fabricated firstly before the succeeding process. The aspect ratio of the trench correlates with the cell size and the number of the transistors accommodated in a unit area. However, the greater the aspect ratio is, the more likely the pillar is to bend or fracture. Therefore, a higher aspect ratio may cause a lower yield. Especially in the 40 nm process, pillars are likely to bend or even collapse because of the high aspect ratio.

SUMMARY OF THE INVENTION

The primary objective of the present invention is to solve the problem that a high aspect ratio makes pillars likely to bend or collapse.

To achieve the above-mentioned objective, the present invention proposes a method for fabricating buried bit lines, which comprises the steps of:

Step S1: defining a plurality of parallel masked regions and a plurality of first etched regions on the surface of a substrate, wherein each first etched region is formed between any two neighboring masked regions, and wherein the width of the masked region is greater than the width of the first etched region;

Step S2: etching the substrate where the first etched regions are formed to form a plurality of first trenches corresponding to the first etched regions and a plurality of first pillars corresponding to the masked regions;

Step S3: implanting first conductive ions into two sidewalls of each first trench to form two bit lines respectively on two sidewalls of each first pillar;

Step S4: filling a packing material into the first trenches;

Step S5: respectively forming a plurality of second etched regions on the first pillars to parallel to the first etched regions without contacting the packing material; and Step S6: etching the second etched regions to form a plurality of second trenches and a plurality of second pillars, and wherein the second pillars are corresponding to the bit lines.

In one embodiment, the ratio of the widths of the masked region and the first etched region is 3:1.

In one embodiment, the substrate includes a semiconductor layer, a first isolation layer, an etching retard layer and a second isolation layer that are stacked in sequence. The masked regions are formed on the surface of the second isolation layer. The semiconductor layer is made of silicon; the first isolation layer and the second isolation layer are made of silicon nitride; the etching retard layer is made of silicon dioxide.

In one embodiment, the packing material is made of silicon dioxide.

In one embodiment, a plurality of photoresist layers are deposited on the surface of the substrate to form the masked regions in Step S1.

In one embodiment, Step S5 further comprises the following steps:

Step S5A: etching away the second isolation layer to allow the packing material to protrude from the etching retard layer;

Step S5B: depositing a blocking layer on the surfaces of the etching retard layer and the packing material through an ALD (Atomic Layer Deposition) or MLD (Molecular Layer Deposition) technique;

Step S5C: performing an etch-back process on the blocking layer and the etching retard layer to form the second etched regions on the surface of the first isolation layer.

In one embodiment, Step S6 is followed by Step S7: implanting second conductive ions into the second trenches where the bit lines are formed to allow the bit lines to include the first conductive ions and the second conductive ions. In one embodiment, the first conductive ions and the second conductive ions are made of an element of Group V.

The present invention is characterized in designing the masked region to be wider than the first etched region and respectively fabricating the first trenches and the second trenches in two stages to form the first pillars and the second pillars. The present invention has the following advantages:

1. The present invention provides sufficient support to prevent the second pillars from bending or collapsing during fabrication;
2. The present invention has a simple fabrication process and thus can effectively reduce the fabrication cost;
3. The present invention can apply to the future process for reducing cell size.

DETAILED DESCRIPTION OF THE PREFERRED EMBODIMENTS

The technical contents of the present invention are described in detail in cooperation with drawings below.

The present invention proposes a method for fabricating buried bit lines. Below, the process of fabricating DRAM is used to exemplify the method of the present invention. Refer to FIGS. 1A to 1H. The method of the present invention comprises the following steps.

Figure 1A:
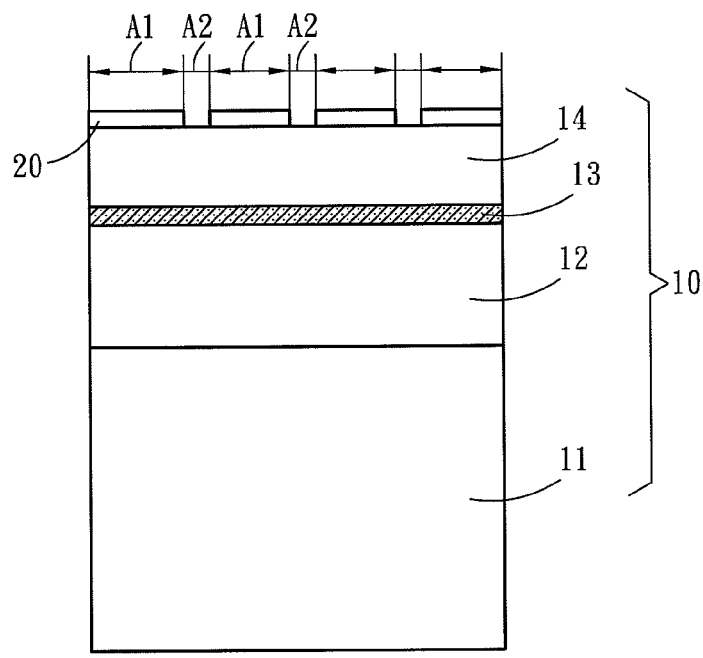
FIGS. 1A to 1H schematically show the process of a method for fabricating buried bit lines according to one embodiment of the present invention.

Step S1: defining a plurality of parallel masked regions A1 and a plurality of first etched regions A2 on the surface of a substrate 10, wherein each first etched region A2 is formed between any two neighboring masked regions A1, and wherein the width of the masked region A1 is greater than the width of the first etched region A2 as shown in FIG. 1A. In one embodiment, for the convenience of the succeeding processes, the substrate 10 includes a semiconductor layer 11, a first isolation layer 12, an etching retard layer 13 and a second isolation layer 14 that are stacked in sequence. The semiconductor layer 11 is made of silicon; the first isolation layer 12 and the second isolation layer 14 are made of silicon nitride; the etching retard layer 13 is made of silicon dioxide. In one embodiment, a negative photoresist material is deposited on the surface of the substrate 10 to form a plurality of parallel photoresist layers 20 serving as the masked regions A1. As the negative photoresist material is inexpensive, the fabrication cost can be reduced. The ratio of the widths of the masked region A1 and the first etched region A2 is 3:1 in FIG. 1A, but it is not the limitation. The ratio of the widths of the masked region A1 and the first etched region A2 can be varied according to practical requirement. For example, the ratio of the widths of the masked region A1 and the first etched region A2 may be 3:2 or 5:1.

Figure 1B:
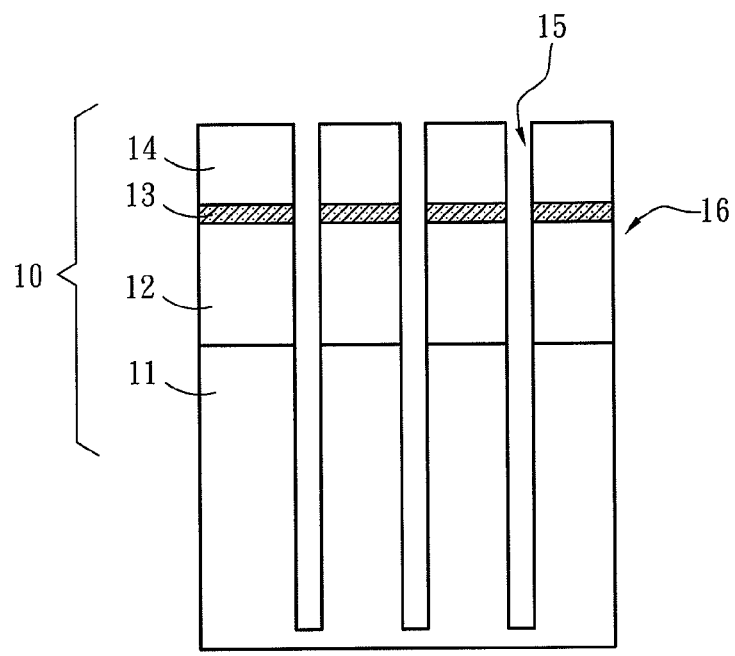

Step S2: etching the substrate 10 where the first etched regions A2 are formed to form a plurality of first trenches 15 corresponding to the first etched regions A2 and a plurality of first pillars 16 corresponding to the masked regions A1 as shown in FIG. 1B. As the ratio of the widths of the masked region A1 and the first etched region A2 is 3:1, the width of the first pillar 16 is three times of the width of the first trench 15 Thus, the first pillar 16 is stronger and able to sustain higher stress.

Figure 1C:
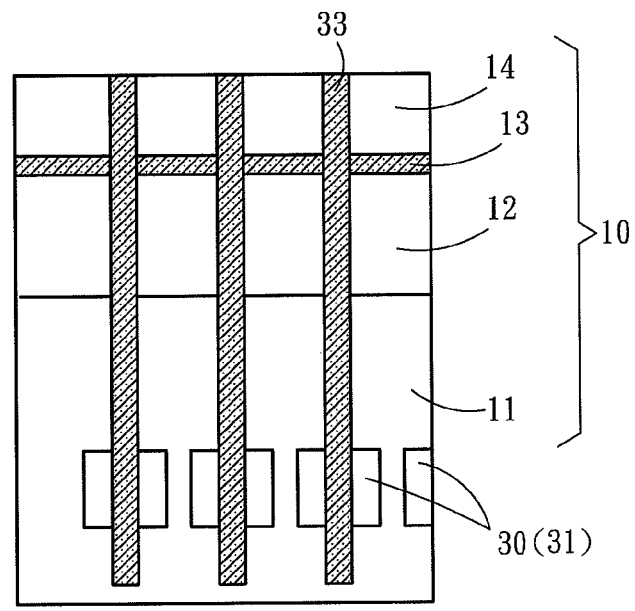

Step S3: implanting first conductive ions 31 into two sidewalls of each first trench 15 to form two bit lines 30 respectively on two sidewalls of each first pillar 16 as shown in FIG. 1C. In one embodiment, the first conductive ions 31 are made of an element of Group V, such as phosphorous or arsenic.

Step S4: filling a packing material 33 into the first trenches 15 as shown in FIG. 3C. In one embodiment, the packing material 33 is made of silicon dioxide.

Figure 1D:
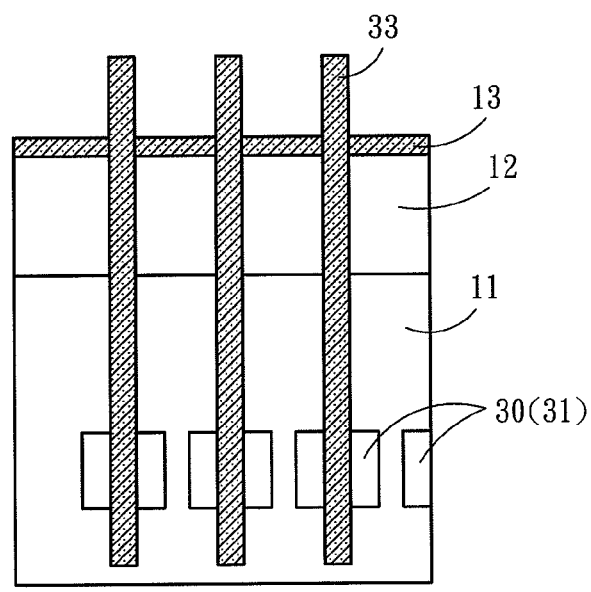
Figure 1E:
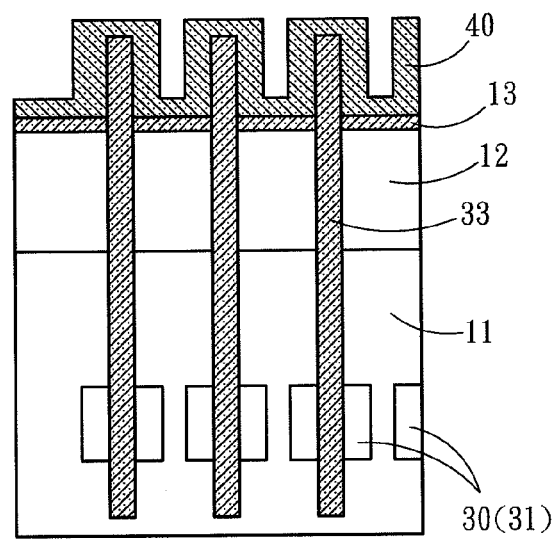
Figure 1F:
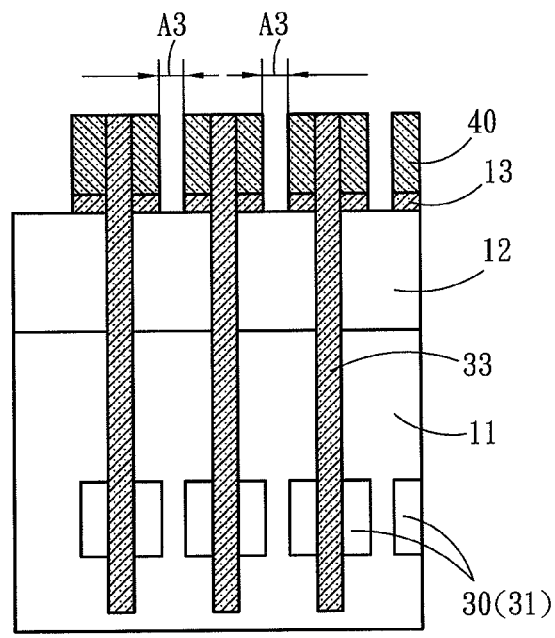

Step S5: respectively forming a plurality of second etched regions A3 to parallel to the first etched regions A2 without contacting the packing material 33 as shown in FIG. 1F. Refer to FIGS. 1D-1F. Step S6 further comprises the following steps.

Step S5A: etching away the second isolation layer 14 to allow the packing material 33 to protrude from the etching retard layer 13 as shown in FIG. 1D.

Step S5B: depositing a blocking layer 40 on the surfaces of the etching retard layer 13 and the packing material 33 as shown in FIG. 1E. In one embodiment, the blocking layer 40 is deposited on the surfaces of the etching retard layer 13 and the packing material 33 in a linear deposition way through an ALD (Atomic Layer Deposition) or MLD (Molecular Layer Deposition) technique. In one embodiment, the blocking layer 40 can be made of the same material as the etching retard layer 13, namely silicon dioxide.

Figure 1G:
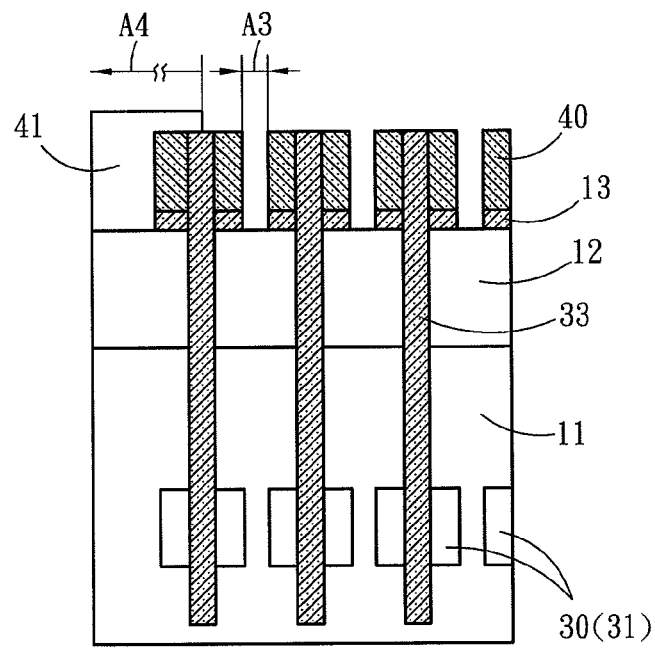
Figure 1H:
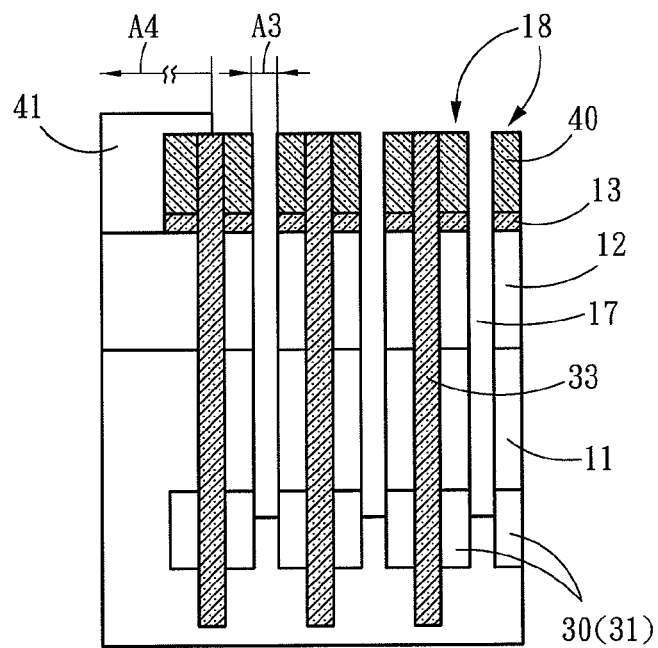

Step S5C: performing an etch-back process on the blocking layer 40 and the etching retard layer 13 to form the second etched regions A3 on the surface of the first isolation layer 12 as shown in FIG. 1F. As the blocking layer 40 and the etching retard layer 13 are made of the same material, when the blocking layer 40 and the etching retard layer 13 are etched for a certain depth via the etch-back process, the surface of the first isolation layer 12 is revealed to form the second etched regions A3. Further, in order to prevent a neighboring region A4 from being affected by the succeeding processes, a covering layer 41 is formed on the neighboring region A4 as shown in FIG. 1G Step S6: etching the second etched regions A3 to form a plurality of second trenches 17 and a plurality of second pillars 18 formed at two sides of the second trench 17 as shown in FIG. 1H. Thereby, each second pillar 18 is corresponding to two buried bit lines 30. The packing material 33 provides support to prevent the second pillars 18 from bending or collapsing when the second etched regions A3 are etched.

Figure 2A:
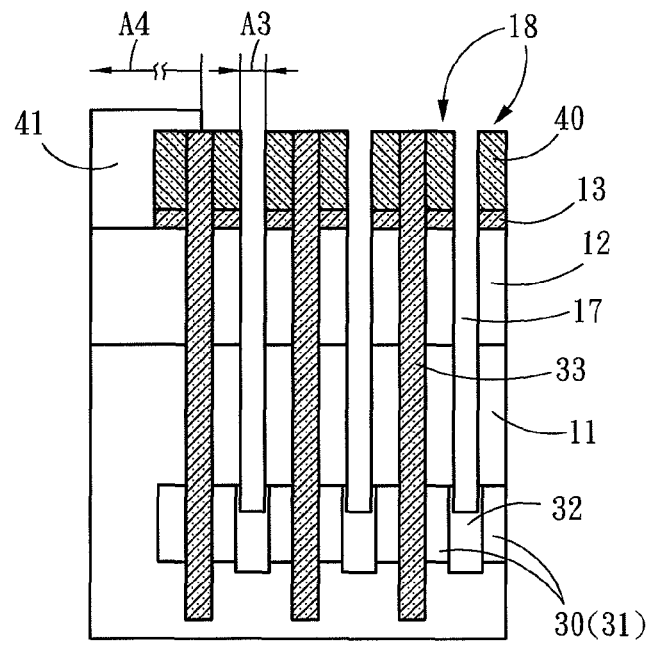
FIG. 2A and FIG. 2B schematically show the process of a method for fabricating buried bit lines according to another embodiment of the present invention.
Figure 2B:
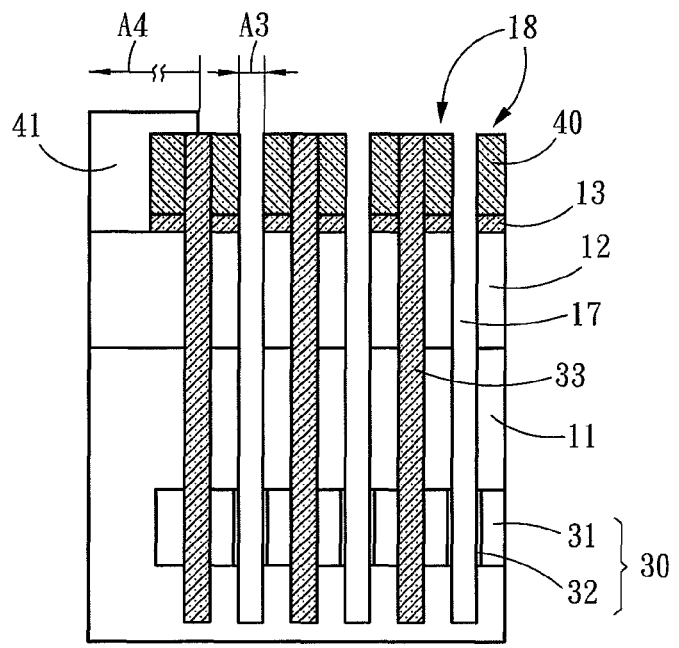

Step S7: implanting second conductive ions 32 into the second trenches 17 where the bit lines 30 are formed as shown in FIG. 2A and FIG. 2B. The second conductive ions 32 are deposited first, and then the second trenches 17 are etched again to allow the bit lines 30 to include the first conductive ions 31 and the second conductive ions 32. The second conductive ions 32 may be identical to or different from the first conductive ions 31, according to practical requirement. It is because the first conductive ions 31 are not necessarily connected with the second trenches 17. Therefore, additional implant of the second conductive ions 32 is undertaken if necessary. Thereby, the bit line 30 can electrically interconnect with the first trench 15 and the second trench 17 through the first and second conductive ions 31 and 32.

Via the above-mentioned steps are obtained buried bit lines 30 and pillars with high aspect ratio. To complete DRAM, the succeeding steps will be undertaken to fabricate word lines, contacts and capacitors and polish.

The present invention is characterized in designing the masked region to be wider than the first etched region and respectively fabricating the first trenches and the second trenches in two stages to form the first pillars and the second pillars. The present invention has the following advantages:

1. The present invention can fabricate the second pillars with high aspect ratio and provide sufficient support to prevent the second pillars from bending or collapsing during fabrication. Thereby, the present invention can reduce the defective fraction in fabricating the second pillars and the bit lines. Therefore, the present invention can apply to the sub-40 nm process to promote the yield of products.
2. The present invention does not use the positive photoresist material but adopts the inexpensive negative photoresist material. Therefore, the present invention can effectively reduce the cost.
3. The present invention has a simple fabrication process and thus can effectively reduce the fabrication cost.
4. The present invention can also be used to fabricate word lines and thus can effectively reduce the feature size of electronic elements.

The present invention possesses utility, novelty and non-obviousness and meets the condition for a patent. Thus, the Inventors file the application for a patent. It is appreciated if the patent is approved fast.

The embodiments described above are only to exemplify the present invention but not to limit the scope of the present invention. Any equivalent modification or variation according to the spirit of the present invention is to be also included within the scope of the present invention.

What is claimed is:

1. A method for fabricating buried bit lines, comprising the steps of:

Step S1: defining a plurality of parallel masked regions and a plurality of first etched regions on a surface of a substrate, wherein each of the plurality of first etched regions is formed between any two neighboring masked regions, and wherein each of the plurality of masked regions is formed at a width greater than that of each of the plurality of first etched regions;

Step S2: etching the substrate where the plurality of first etched regions are formed to form a plurality of first trenches corresponding to the plurality of first etched regions and a plurality of first pillars corresponding to the plurality of masked regions;

Step S3: implanting first conductive ions into two sidewalls of each of the plurality of first trenches to form two bit lines respectively on two sidewalls of each of the plurality of first pillars;

Step S4: filling a packing material into the plurality of first trenches;

Step S5: respectively forming a plurality of second etched regions on the plurality of first pillars to parallel to the plurality of first etched regions without contacting the packing material; and Step S6: etching the plurality of second etched regions to form a plurality of second trenches and a plurality of second pillars, and wherein the plurality of second pillars are corresponding to the bit lines.

2. The method for fabricating buried bit lines according to claim 1, wherein a ratio of the widths of the masked region and the first etched regions is 3:1.

3. The method for fabricating buried bit lines according to claim 1, wherein the substrate includes a semiconductor layer, a first isolation layer, an etching retard layer and a second isolation layer that are stacked in sequence.

4. The method for fabricating buried bit lines according to claim 3, wherein the semiconductor layer is made of silicon; the first isolation layer and the second isolation layer are made of silicon nitride; the etching retard layer is made of silicon dioxide.

5. The method for fabricating buried bit lines according to claim 3, wherein the Step S5 further comprises the steps of Step S5A: etching away the second isolation layer to allow the packing material to protrude from the etching retard layer;

Step S5B: depositing a blocking layer on surfaces of the etching retard layer and the packing material; and Step S5C: performing an etch-back process on the blocking layer and the etching retard layer to form the plurality of second etched regions on a surface of the first isolation layer.

6. The method for fabricating buried bit lines according to claim 5, wherein in the Step S5B, the blocking layer is deposited through an ALD (Atomic Layer Deposition) or MLD (Molecular Layer Deposition) technique.

7. The method for fabricating buried bit lines according to claim 1, wherein the packing material is made of silicon dioxide.

8. The method for fabricating buried bit lines according to claim 1, wherein the plurality of masked regions are formed by depositing a plurality of photoresist layers on the surface of the substrate.

9. The method for fabricating buried bit lines according to claim 1 further comprising Step S7 after the Step S6: implanting second conductive ions into the second trenches where the bit lines are formed to allow the bit lines to include the first conductive ions and the second conductive ions.

10. The method for fabricating buried bit lines according to claim 9, wherein the first conductive ions and the second conductive ions are made of an element of Group V.

* * * * *